US005636237A

United States Patent [19]
Terakado et al.

[11] Patent Number: 5,636,237
[45] Date of Patent: Jun. 3, 1997

[54] SEMICONDUCTOR LASER DEVICE WHICH MAKES IT POSSIBLE TO REALIZE HIGH-SPEED MODULATION

[75] Inventors: Tomoji Terakado; Toshitaka Torikai, both of Tokyo, Japan

[73] Assignee: NEC Corporation, Japan

[21] Appl. No.: 595,169

[22] Filed: Jan. 30, 1996

[30] Foreign Application Priority Data

Jan. 31, 1995 [JP] Japan .................................. 7-014660

[51] Int. Cl.$^6$ .................................................. H01S 3/19
[52] U.S. Cl. .................................................. 372/46
[58] Field of Search .............................. 372/46, 45, 26

[56] References Cited

U.S. PATENT DOCUMENTS

| 5,345,464 | 9/1994 | Takemoto ................. | 372/46 |
| 5,383,213 | 1/1995 | Irikawa et al. ............. | 372/46 |
| 5,390,205 | 2/1995 | Mori et al. ................. | 372/46 |
| 5,559,820 | 9/1996 | Kimura et al. ............. | 372/46 |
| 5,561,681 | 10/1996 | Nishimura ................. | 372/46 |

OTHER PUBLICATIONS

Wada et al; "1.55 µm DFB Lasers With FeDoped InP Current Blocking Layers Grown By Two–Step Movpe"; Nov. 16, 1988; pp.133–134; Electronics Letters Jan. 19, 1989 vol. 25 No. 2.
Torikai et al; "Anjustment–free MQW Laser Diodes for Fiber–Optic Subscriber Loop Application"; Nov. 1993; pp. 43–48; Technical Report of IEICE.
Oka et al; "Low–threshold 1.3µm MQW laser array for optical interconnections"; Feb. 1993; pp. 13–18; Technical Report of IEICE.
Ohkura et al; "Low Threshold FS–BH Laser ON p–InP Substrate Grown by All–MOCVD"; Sep 10, 1992; pp. 1844–1845; Electronics Letters vol. 28, No. 19.

*Primary Examiner*—James W. Davie
*Attorney, Agent, or Firm*—Hayes, Soloway, Hennessey, Grossman & Hage, P.C.

[57] ABSTRACT

In a laser device in which a first cladding layer (11b) of InP of p-type, an active layer (12) of InGaAsP, and a second cladding layer (13) of InP of n-type are successively formed on a predetermined area of a base layer (10, 11a) of InP of p-type, a current confining structure includes, to confine a current in the active layer, a pair of first buried layers (14) of InP of p-type on a remaining area of the base layer, a pair of first current blocking layers (15) of InP of n-type on the pair of first buried layers, a pair of second current blocking layers (16) of a semi-insulating InP on the pair of first current blocking layers, and a second buried layer (17) of InP of n-type on the pair of second current blocking layers. The pair of first buried layers have a pair of projecting portions (14a) projecting over inner edge portions of the pair of first buried layers with the first cladding, the active, and the second cladding layers interposed between the pair of projecting portions and with the pair of projecting portions brought into contact with side surfaces of the active layer and with inner edge portions of the pair of second current blocking layers so that the pair of first current blocking layers are electrically isolated from the active layer. Instead of the pair of second current blocking layers, a pair of low carrier concentration layers (22) of InP of n-type (or p-type) and a pair of current blocking layers (23) of p-type may be successively formed on the pair of first current blocking layers.

33 Claims, 2 Drawing Sheets

SEMICONDUCTOR LASER DEVICE WHICH MAKES IT POSSIBLE TO REALIZE HIGH-SPEED MODULATION

BACKGROUND OF THE INVENTION

This invention relates to a semiconductor laser device which is used as a main structural component in an optical communication system.

As a progress of an optical communication technique, an application field of the optical communication technique has remarkably been spreading from a trunk line transmission system to an optical access network system of, for example, an optical subscriber system, an LAN (local area network), and a data link. Inasmuch as a lot of semiconductor laser devices are used in communication in such fields in various environments, it is requested that the semiconductor laser devices have a low cost and a resistance for various environments. To achieve this requirement, it is desired that a light emitting layer (namely, an active layer) and a buried layer of the semiconductor laser device are produced or grown by the use of an MOVPE (metal-organic vapor phase epitaxy) process which is also called an MOCVD (metal-organic chemical vapor deposition) process. By using the MOVPE process, the light emitting layer and the buried layer of the laser device can uniformly be grown on a substrate of a large area with a high controllability.

Under the circumstances, a conventional semiconductor laser device is reported by Y. Ohkura et al in Electronics Letters, 10th September 1992, Vol. 28, No. 19, pages 1844–1845, under the title of "LOW THRESHOLD FS-BH LASER ON p-InP SUBSTRATE GROWN BY ALL-MOCVD". The conventional semiconductor laser device has a buried structure on an InP (indium-phosphorus) substrate of a p-type and is produced by using the MOVPE process in all of crystal growth processes on manufacturing the laser device.

A similar semiconductor laser device is reported by Akihiko Oka et al in Technical Report of IEICE (The Institute of Electronics, Information and Communication Engineers), February 1993, OQE92–168, pages 13–18, under the title of "Low-threshold 1.3 µm MQW laser array for optical interconnections". It is reported that the Oka et al semiconductor laser device exhibits threshold current of 2.6–3.0 mA, slope efficiency of 0.34–0.37 W/A at 25° C. and threshold current of 8.1–9.2 mA, slope efficiency of 0.15–0.17 W/A at 80° C.

However, inasmuch as any one of the abovementioned semiconductor laser devices has a current blocking structure (or a current confining structure) which confines a current in the active layer and which is constituted by a thyristor of a p-n-p-n structure, it is defective that the current blocking structure has a large capacitance within an optimum impurity concentration extent in which a low driving current is statically obtained. For example, the semiconductor laser device has a large capacitance of about 15 pF even when the semiconductor laser device not only has a narrow mesa stripe configura-tion in which a width of the current blocking structure is 30 µm but also has a short cavity configuration in which a cavity (or resonator) length is 200 µm.

When the semiconductor laser device has a large capacitance, a maximum modulation band is restricted to about 10 GHz on a fixed bias condition not less than an ordinary threshold value by restriction of CR time constant. Furthermore, on making the semiconductor laser device carry out zero-biased modulation in the manner described by T. Torikai et al in Technical Report of IEICE (The Institute of Electronics, Information and Communication Engineers), November 1993, OQE93–132, pages 43–48, under the title of "Adjustment-free MQW Laser Diodes for Fiber-Optic Subscriber Loop Application", an increase of jitter occurs on starting operation. This results in further limitation of the maximum modulation band. As a result, even modulation of 1 Gb/s is impossible. It is therefore necessary for the semiconductor laser device to have a capacitance which is not greater than 3.5 pF in order to realize a zero-biased 1 Gb/s modulation at a high speed.

On the other hand, still another semiconductor laser device of a small capacitance is reported by H. Wada et al in Electronics Letters, 19th Jan. 1989, Vol. 25, No. 2, pages 133–134, under the title of "1.55 µm DFB LASERS WITH Fe-DOPED InP CURRENT LAYERS GROWN BY TWO-STEP MOVPE". The semiconductor laser device of a small capacitance is manufactured on an InP substrate of a p-type by using a semi-insulating InP material as a current blocking layer. The semiconductor laser device is realized which has a small capacitance not greater than 4 pF in a case where a cavity (or resonator) length thereof is 250 µm.

However, inasmuch as the semiconductor laser device uses, as the current blocking structure, only the current blocking layer of the semi-insulating InP material which is doped with Fe (iron), the semiconductor laser device inevitably exhibits an increased threshold current of 30 mA at a room temperature. It is therefore impossible for the semiconductor laser device to operate a high-speed and zero-biased modulation which needs a low threshold current which is not greater than 5 mA.

The reasons why the semiconductor laser device exhibits an increased threshold current will now be described.

(1) Inasmuch as the current blocking layer of the semi-insulating InP material doped with Fe is unavoidably brought into contact with an InP layer of a p-type in the semiconductor laser device, diffusion of Fe into the InP layer of the p-type unavoidably occurs on manufacturing the semiconductor laser device. Due to such diffusion of Fe, the InP layer of the p-type inevitably has a decreased concentration of Fe. This results in an increase of a leakage current which flows outside the active layer.

(2) The current blocking layer of the semi-insulating InP material doped with Fe has no current blocking effect for holes. This also results in an increase of the leakage current which flows outside the active layer.

As described above, each of the above-mentioned semiconductor laser devices manufactured on the InP substrate of the p-type is incapable of easily realizing zero-biased 1 Gb/s modulation at a high speed.

SUMMARY OF THE INVENTION

It is therefore an object of this invention to remove the above-mentioned problems (1) and (2) and to provide a semiconductor laser device which has a decreased capacitance so as to make it possible to realize high-speed modulation.

It is another object of this invention to provide a semiconductor laser device of the type described, which is operable by a decreased driving current.

Other objects of this invention will become clear as the description proceeds.

On describing the gist of this invention, it is possible to understand that a semiconductor laser device comprises: a base layer of a semiconductor material of a first conductivity type, the base layer having a principal surface; a first cladding layer of a semiconductor material of the first conductivity type, the first cladding layer being formed on a predetermined area of the principal surface; an active layer of a stripe shape, the active layer being formed on the first cladding layer and having a pair of side surfaces opposed to each other; a second cladding layer of a semiconductor material of a second conductivity type, the second cladding layer being formed on the active layer; and a pair of current confining regions formed on a remaining area of the principal surface with the first cladding, the active, and the second cladding layers interposed between the pair of current confining regions. The pair of current confining regions are for confining a current in the active layer.

According to a first aspect of this invention, the pair of current confining regions comprise in the above-mentioned semiconductor laser device: a pair of first buried layers of a semiconductor material of the first conductivity type, the pair of first buried layers being formed on the remaining area of the principal surface; a pair of first current blocking layers of a semiconductor material of the second conductivity type, the pair of first current blocking layers being formed on the pair of first buried layers; a pair of second current blocking layers of a semi-insulating material, the pair of second current blocking layers being formed on the pair of first current blocking layers; and a pair of second buried layers of a semiconductor material of the second conductivity type. The pair of second buried layers are formed on the pair of second current blocking layers. The pair of first buried layers have a pair of projecting portions projecting over inner edge portions of the pair of first buried layers with the first cladding, the active, and the second cladding layers interposed between the pair of projecting portions and with the pair of projecting portions brought into contact with the side surfaces of the active layer and with inner edge portions of the pair of second current blocking layers so that the pair of first current blocking layers are electrically isolated from the active layer.

According to a second aspect of this invention, the pair of current confining regions comprise in the above-mentioned semiconductor laser device; a pair of first buried layers of a semiconductor material of the first conductivity type, the pair of first buried layers being formed on the remaining area of the principal surface; a pair of first current blocking layers of a semiconductor material of the second conductivity type, the pair of first current blocking layers being formed on the pair of first buried layers; a pair of low carrier concentration layers of a semiconductor material of the second conductivity type, the pair of low carrier concentration layers having a carrier concentration lower than that of each of the pair of first current blocking layers and formed on the pair of first current blocking layers; a pair of second current blocking layers of a semiconductor material of the first conductivity type, the pair of second current blocking layers being formed on the pair of low carrier concentration layers; and a pair of second buried layers of a semiconductor material of the second conductivity type. The pair of second buried layers are formed on the pair of second current blocking layers. The pair of first buried layers have a pair of projecting portions projecting over inner edge portions of the pair of first buried layers with the first cladding, the active, and the second cladding layers interposed between the pair of projecting portions and with the pair of projecting portions brought into contact with the side surfaces of the active layer and with inner edge portions of the pair of second current blocking layers so that the pair of first current blocking layers are electrically isolated from the active layer.

According to a third aspect of this invention, the pair of current confining regions comprise in the above-mentioned semiconductor laser device: a pair of first buried layers of a semiconductor material of the first conductivity type, the pair of first buried layers being formed on the remaining area of the principal surface; a pair of first current blocking layers of a semiconductor material of the second conductivity type, the pair of first current blocking layers being formed on the pair of first buried layers; a pair of low carrier concentration layers formed on the pair of first current blocking layers; a pair of second current blocking layers of a semiconductor material of the first conductivity type, the pair of second current blocking layers being formed on the pair of low carrier concentration layers; and a pair of second buried layers of a semiconductor material of the second conductivity type. The pair of second buried layers are formed on the pair of second current blocking layers. The pair of low carrier concentration layers are of a semiconductor material of the first conductivity type and have a carrier concentration lower than that of each of the pair of second current blocking layers. The pair of first buried layers have a pair of projecting portions projecting over inner edge portions of the pair of first buried layers with the first cladding, the active, and the second cladding layers interposed between the pair of projecting portions and with the pair of projecting portions brought into contact with the side surfaces of the active layer and with inner edge portions of the pair of second current blocking layers so that the pair of first current blocking layers are electrically isolated from the active layer.

PRINCIPLE OF THE INVENTION

Description will proceed to a principle of this invention. As described above, it is necessary to decrease a capacitance of the semiconductor laser device in order to make the semiconductor laser device operate high-speed modulation. The capacitance of the semiconductor laser device essentially consists of a capacitance of the active layer and another capacitance of the current blocking structure. The capacitance of the current blocking structure is called a parasitic capacitance in the art. It is therefore desired that the capacitance of the current blocking structure has a decreased value. Inasmuch as any one of the above-mentioned conventional semiconductor laser devices has the current blocking or confining structure constituted by a thyristor of a p-n-p-n structure, it is defective that the capacitance of a p-n junction of the current blocking structure has a large value relative to the capacitance of the active layer within an optimum impurity concentration extent in which a low driving current is statically obtained as also mentioned above.

This invention achieves a decreased capacitance of the current blocking structure by using either the pair of current blocking layers of the semi-insulating material or the pair of low carrier concentration layers as a part of the current blocking structure constituted by the pair of current confining regions to thereby widen a depletion layer of the p-n junction.

More specifically, according to a parallel-plate approximation, the p-n junction capacitance C is represented by:

$$C = \epsilon \epsilon_0 S/d,$$

where $\epsilon$ represents a dielectric constant of the semiconductor material, $\epsilon_0$ representing another dielectric constant of empty space, S representing a junction area of the p-n junction, d representing a thickness of the depletion layer. In order to realize the decreased capacitance equal to or less than 3.5 pF in the semiconductor device in which a width of the current blocking structure is 30 μm and which a cavity (or resonator) length is 200 μm, it is necessary to form the depletion layer of about 0.2 μm.

In order to form such depletion layer, this invention uses either the pair of current blocking layers of the semi-insulating material or the pair of low carrier concentration layers as a part of the current blocking structure constituted by the pair of current confining regions as mentioned above.

DESCRIPTION OF THE PREFERRED EMBODIMENTS

Figure 1:
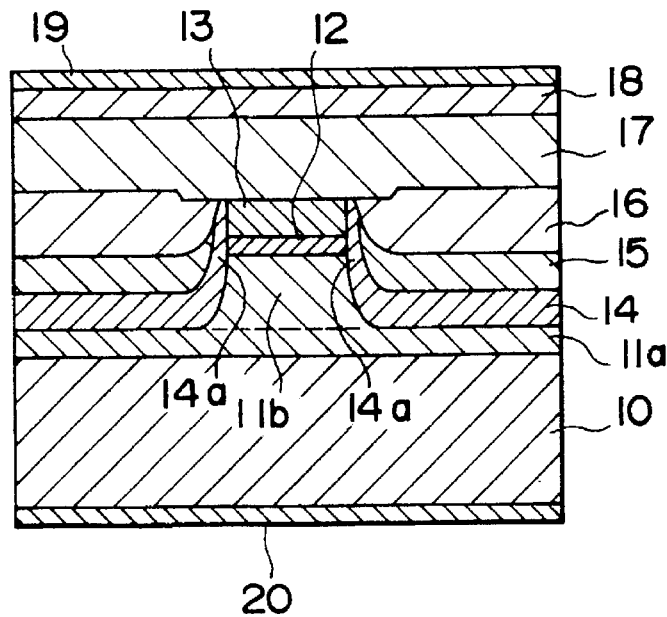
FIG. 1 is a cross-sectional view of a semiconductor laser device according to a first embodiment of this invention.

Referring to FIG. 1, a semiconductor laser device according to a first embodiment of this invention comprises a substrate 10 of an InP (indium-phosphorus) semiconductor material of a p-type (a first conductivity type). A base cladding layer 11a of an InP semiconductor material of the p-type is formed on a front surface of the substrate 10 and has a principal surface.

A combination of the substrate 10 and the base cladding layer 11a is referred to as a base layer which is of a semiconductor material of the p-type and which has the principal surface.

A first cladding layer 11b of an InP semiconductor material of the p-type is formed on a predetermined area of the principal surface.

An active layer 12 of a stripe shape is formed on the first cladding layer 11b and has a pair of side surfaces opposed to each other. The active layer 12 is of an InGaAsP (indium-gallium-arsenic-phosphorus) material which has a quantum well structure. Alternatively, the active layer 12 may be of an InGaAsP material which is a bulk material.

A second cladding layer 13 of an InP semiconductor material of an n-type (a second conductivity type) is formed on the active layer 12.

A pair of current confining regions which will presently be described, are formed on a remaining area of the principal surface of the base cladding layer 11a with the first cladding, the active, and the second cladding layers 11b, 12, and 13 interposed between the pair of current confining regions. The pair of current confining regions are for confining a current in the active layer 12.

The pair of current confining regions comprise a pair of first buried layers 14, a pair of first current blocking layers 15, a pair of second current blocking layers 16, and a pair of second buried layers 17. The pair of first buried layers 14 are of an InP semiconductor material of the p-type and are formed on the remaining area of the principal surface of the base cladding layer 11a. The pair of first current blocking layers 15 are of an InP semiconductor material of the n-type and are formed on the pair of first buried layers 14.

The pair of second current blocking layers 16 are of a semi-insulating InP material which is, preferably, doped with Fe (iron). The pair of second current blocking layers 16 are formed on the pair of first current blocking layers 15.

The pair of second buried layers 17 are of an InP semiconductor material of the n-type and are formed on the pair of second current blocking layers 16. In the illustrated example, the second buried layer 17 is furthermore formed on the second cladding layer 13.

The pair of first buried layers 14 have a pair of projecting portions 14a. The pair of projecting portions 14a project over inner edge portions of the pair of first buried layers 14 with the first cladding, the active, and the second cladding layers 11b, 12, and 13 interposed between the pair of projecting portions 14a and with the pair of projecting portions 14a brought into contact with the side surfaces of the active layer 12 and with inner edge portions of the pair of second current blocking layers 16 so that the pair of first current blocking layers 15 are electrically isolated from the active layer 12.

A contact layer 18 is of an InGaAsP semiconductor material which is of an n-type and which has a high carrier concentration (or a high impurity concentration). That is, the InGaAsP semiconductor material has impurities of the n-type at a high concentration. In the art, the semiconductor material of the n-type and of the high carrier concentration is called a semiconductor material of an $n^+$-type, where $^+$ representing the high carrier concentration). The contact layer 18 is formed on an entire surface of the second buried layer 17.

A first electrode 19 is formed on the contact layer 18 as an n-electrode. A second electrode 20 is formed on a bottom surface of the substrate 10 as a p-electrode.

Description will proceed to a method of manufacturing the semiconductor laser device. On an entire surface of a (100) crystal facet of the substrate 10 (thickness: 350 μm), the base and the first cladding layers 11a and 11b (thickness: 1.5 μm, carrier concentration: $5 \times 10^{17} \text{cm}^{-3}$), the active layer 12 (thickness: 0.2 μm, emitting light wavelength: 1.3 μm), the second cladding layer 13 (thickness: 0.5 μm, carrier concentration: $1 \times 10^{18} \text{cm}^{-3}$), and an etching layer (not shown) of an InGaAs (indium-gallium-arsenic) semiconductor material of the n-type (thickness: 0.1 μm, carrier concentration: $1 \times 10^{18} \text{cm}^{-3}$) are successively grown by the use of an MOVPE (metal-organic vapor phase epitaxy) process.

Subsequently, a stripe mask of $SiO_2$ is formed on the etching layer in a<011> direction of the substrate 10 by the use of a CVD (chemical vapor deposition) process and a photolithography process. The stripe mask has a thickness of 200 nm and a width of 4 μm and is positioned so that the stripe shape of the active layer 12 can be formed.

By carrying out a selective etching process by the use of a combination acid of HBr, $H_2O_2$, and $H_2O$ and by using the stripe mask as a selective etching mask, a mesa portion is formed which comprises the active layer 12 (width: 1.5) and the first and the second cladding layers 11b and 13. In this event, the remaining area of the principal surface of the base cladding layer 11a is exposed.

Subsequently, the pair of first buried layers 14 (thickness: 0.3 μm, carrier concentration: $5 \times 10^{17} \text{cm}^{-3}$) having the pair of projecting portions 14a, the pair of first current blocking layers 15 (thickness: 0.5 μm, carrier concentration: $1 \times 10^{18} \text{cm}^{-3}$), and the pair of second current blocking layers (doped with Fe) 16 (thickness: 0.7 μm, Fe concentration: $5 \times 10^{17} \text{cm}^{-3}$) are successively grown on the remaining area of the principal surface of the base cladding layer 11a by the use of the MOVPE process and by using the stripe mask as a selective growing mask.

Thereafter, the stripe mask is removed by the use of a hydrofluoric acid and, then, the second buried layer 17

(thickness: 2.5 μm, carrier concentration: $1\times10^{18}\text{cm}^{-3}$) is grown not only on the pair of second current blocking layers 16 but also on the second cladding layer 13 by the use of the MOVPE process. Subsequently, the contact layer 18 (thickness: 0.5 μm, carrier concentration: $1\times10^{19}\text{cm}^{-3}$) is grown on the second buried layer 17 by the use of the MOVPE process. On the contact layer 18, the first electrode 19 of AuGeNi is formed as the n-electrode.

After that, the bottom surface of the substrate 10 is polished or lapped on so that the substrate 10 has a thickness of about 100 μm and, then, the second electrode 20 of AuZn is formed on the bottom surface of the substrate 10 as the p-electrode.

Finally, the semiconductor laser device is made to have a predetermined length by cleavage of a semiconductor wafer manufactured in the manner described above. On both longitudinal edge surfaces of the semiconductor laser device, a multilayer film of an $SiO_2$ and an amorphous-Si is coated in order to control reflectances of the longitudinal edge surfaces.

Figure 2:
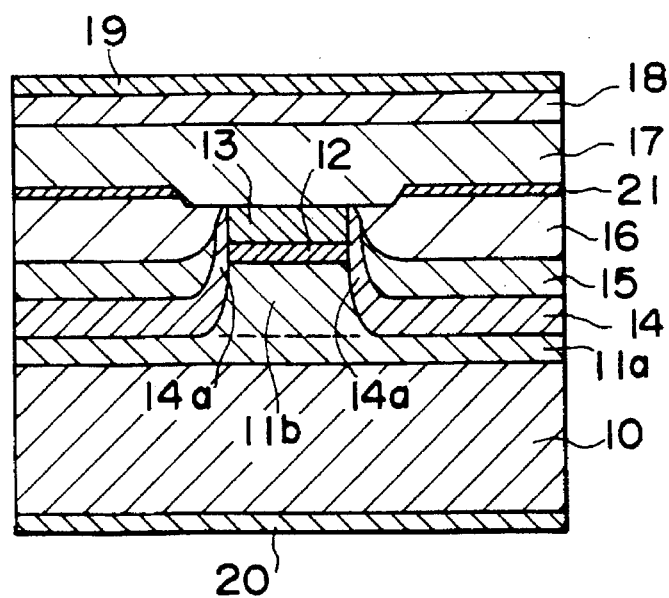
FIG. 2 is a cross-sectional view of a semiconductor laser device according to a second embodiment of this invention.

Referring to FIG. 2, a semiconductor laser device according to a second embodiment of this invention is similar in structure and in operation to the semiconductor laser device of FIG. 1 except that a pair of recombination layers 21 of an InGaAsP material are formed between the pair of second current blocking layers 16 and the second buried layer 17. In the illustrated example, the pair of recombination layers 21 are of an undoped InGaAsP material having a band gap which is less than that of any one of the InP semiconductor material of the p-type and the InP semiconductor material of the n-type.

Alternatively, a pair of recombination layers of an InGaAs material may be formed between the pair of second current blocking layers 16 and the second buried layer 17 instead of the pair of recombination layers 21 of the InGaAsP material.

On manufacturing the semiconductor laser device, the pair of recombination layers 21 (thickness: 0.1 μm) of the undoped InGaAsP material having a band gap wavelength of 1.2 μm are grown on the pair of second current blocking layers 16 by the use of the MOVPE process and by using the stripe mask as the selective growing mask. In this event, in order to elevate an effect due to the recombination layers 21, the pair of recombination layers 21 are located at an upper position which is upper than a position of the stripe mask so that the pair of recombination layers 21 are farther from the active layer 12 by at least 1 μm. As a result, an excess waveguide loss due to light absorption is suppressed and a current blocking effect is elevated.

Description will proceed to an effect due to the recombination layers 21. The recombination layers 21 are for enabling operation of the semiconductor laser device by a decreased driving current at a higher temperature which is equal to or higher than 85° C.

In the current blocking structure constituted by a thyristor of a p-n-p-n structure in each of the above-mentioned conventional semiconductor devices, it is defective that the driving current increases because a leakage current drastically increases due to a turn-on operation of the thyristor at the higher temperature.

Provision of the recombination layers 21 can shorten a life time of each hole introduced into a gate of the thyristor and can thereby suppresses the turn-on operation of the thyristor because the hole in question is recombined in the recombination layers 21. Inasmuch as the leakage current is suppressed even at the higher temperature, there is provided a semiconductor laser device which is operable by a decreased driving current even at the higher temperature, equal to or higher than 85° C. This is achieved when the InGaAsP material of the recombination layer 21 has a band gap which is less than that of any one of the InP semiconductor material of the p-type and the InP semiconductor material of the n-type.

Figure 3:
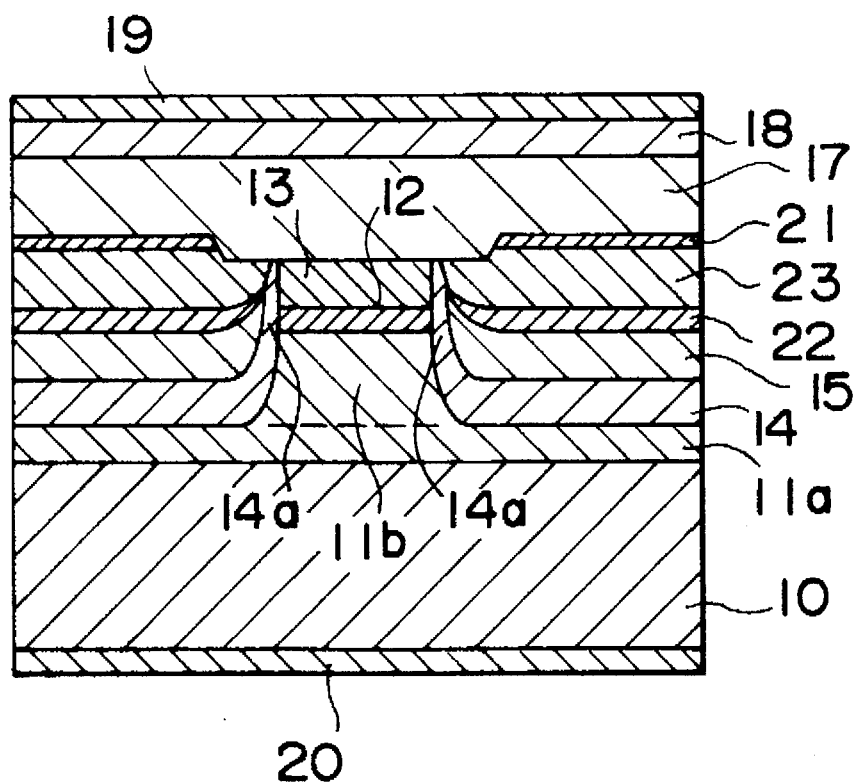
FIG. 3 is a cross-sectional view of a semiconductor laser device according to a third embodiment of this invention.

Referring to FIG. 3, a semiconductor laser device according to a third embodiment of this invention is similar in structure and in operation to the semiconductor laser device of FIG. 2 except that a pair of second current blocking layers 23 of an InP semiconductor material of the p-type are used instead of the pair of second current blocking layers 16 of the semi-insulating InP material and that a pair of low carrier concentration layers 22 (which will presently be described) are formed between the pair of first current blocking layers 15 of the InP semiconductor material of the n-type and the pair of second current blocking layers 23.

The first buried layer 14, the first current blocking layer 15, the second current blocking layer 23, and the second buried layer 17 constitute a thyristor of a p-n-p-n structure.

Attention will be directed to the pair of low carrier concentration layers 22 which are formed on the pair of first current blocking layers 15. The pair of low carrier concentration layers 22 are of an InP semiconductor material of the n-type and have a carrier concentration lower than that of each of the pair of first current blocking layers 15 of the InP semiconductor material of the n-type. Preferably, the pair of low carrier concentration layers 22 have a carrier concentration less than $1\times10^{17}\text{cm}^{-3}$. On the pair of low carrier concentration layers 22, the pair of second current blocking layers 23 of the InP semiconductor material of the p-type.

Alternatively, the pair of low carrier concentration layers 22 may be of an InP semiconductor material of the p-type to have a carrier concentration which is lower than that of each of the pair of second current blocking layers 23 of the InP semiconductor material of the p-type and which is, preferably, less than $1\times10^{17}\text{cm}^{-3}$.

On manufacturing the semiconductor laser device, the pair of first buried layers 14 (thickness: 0.3 μm, carrier concentration: $5\times10^{17}\text{cm}^{-3}$), the pair of first current blocking layers 15 (thickness: 0.5 μm, carrier concentration: $1\times10^{18}\text{cm}^{-3}$), the pair of low carrier concentration layers 22 (thickness: 0.3 μm, carrier concentration: $5\times10^{16}\text{cm}^{-3}$), the pair of second current blocking layers 23 (thickness: 0.4 μm, carrier concentration: $5\times10^{17}\text{cm}^{-3}$), and the pair of recombination layers 21 (thickness: 0.1 μm) are successively grown on the remaining area of the principal surface of the base cladding layer 11a by the use of the MOVPE process and by using the stripe mask as the selective growing mask.

Estimation is carried out for the semiconductor laser devices of FIGS. 1 to 3, each of which is manufactured to have a cavity (or resonator) length of 200 μm and to have reflectances of 70% and 90% on both longitudinal edge surfaces thereof. As a result, any one of the semiconductor laser devices has a capacitance equal to or less than 3.5 pF and exhibits threshold current of 1 mA, slope efficiency of 0.4 W/A at 20° C. Especially, each of the semiconductor laser devices of FIGS. 1 and 2 exhibits threshold current of 4 mA, slope efficiency of 0.3 W/A at 85° C. Furthermore, a high-speed modulation test is carried out for the semiconductor laser devices. As a result, zero-based 1 Gb/s modulation can be realized in any one of the semiconductor laser devices.

While this invention has thus far been described in conjunction with a few preferred embodiments thereof, it will readily be possible for those skilled in the art to put this invention into practice in various other manners. For example, a diffraction grating may be formed in the vicinity of the active layer 12 in each of the semiconductor laser devices of FIGS. 1 to 3 to make the semiconductor laser device generate a laser beam of a single wavelength and to thereby make the semiconductor laser device be operable as either a DFB (distributed feedback) laser device or a DBR (distributed bragg reflector) laser device.

What is claimed is:

1. A semiconductor laser device comprising: a base layer of a semiconductor material of a first conductivity type, said base layer having a principal surface; a first cladding layer of a semiconductor material of said first conductivity type, said first cladding layer being formed on a predetermined area of said principal surface; an active layer of a stripe shape, said active layer being formed on said first cladding layer and having a pair of side surfaces opposed to each other; a second cladding layer of a semiconductor material of a second conductivity type, said second cladding layer being formed on said active layer; and a pair of current confining regions formed on a remaining area of said principal surface with said first cladding, said active, and said second cladding layers interposed between said pair of current confining regions, said pair of current confining regions being for confining a current in said active layer; said pair of current confining regions comprising:

a pair of first buried layers of a semiconductor material of said first conductivity type, said pair of first buried layers being formed on the remaining area of said principal surface;

a pair of first current blocking layers of a semiconductor material of said second conductivity type, said pair of first current blocking layers being formed on said pair of first buried layers;

a pair of second current blocking layers of a semi-insulating material, said pair of second current blocking layers being formed on said pair of first current blocking layers; and a pair of second buried layers of a semiconductor material of said second conductivity type, said pair of second buried layers being formed on said pair of second current blocking layers;

said pair of first buried layers having a pair of projecting portions projecting over inner edge portions of said pair of first buried layers with said first cladding, said active, and said second cladding layers interposed between said pair of projecting portions and with said pair of projecting portions brought into contact with said side surfaces of said active layer and with inner edge portions of said pair of second current blocking layers so that said pair of first current blocking layers are electrically isolated from said active layer.

2. A semiconductor laser device as claimed in claim 1, each semiconductor material of said first conductivity type being an InP (indium-phosphorus) semiconductor material of a p-type, each semiconductor material of said second conductivity type being an InP semiconductor material of an n-type, wherein said semi-insulating material is a semi-insulating InP material.

3. A semiconductor laser device as claimed in claim 2, wherein said active layer is of an InGaAsP (indium-gallium-arsenic-phosphorus) material.

4. A semiconductor laser device as claimed in claim 3, wherein said InGaAsP material is a bulk material.

5. A semiconductor laser device as claimed in claim 3, wherein said InGaAsP material is a material having a quantum well structure.

6. A semiconductor laser device as claimed in claim 3, wherein said pair of current confining regions further comprise:

a pair of recombination layers of an InGaAsP material, said pair of recombination layers being formed between said pair of second current blocking layers and said pair of second buried layers.

7. A semiconductor laser device as claimed in claim 6, wherein said pair of recombination layers are of the InGaAsP material having a band gap which is less than that of any one of the InP semiconductor material of said p-type and the InP semiconductor material of said n-type.

8. A semiconductor laser device as claimed in claim 3, wherein said pair of current confining regions further comprise:

a pair of recombination layers of an InGaAs material, said pair of recombination layers being formed between said pair of second current blocking layers and said pair of second buried layers.

9. A semiconductor laser device as claimed in claim 8, wherein said pair of recombination layers are of the InGaAs material having a band gap which is less than that of any one of the InP semiconductor material of said p-type and the InP semiconductor material of said n-type.

10. A semiconductor laser device as claimed in claim 2, wherein said semi-insulating material is the semi-insulating InP material which is doped with Fe (iron).

11. A semiconductor laser device as claimed in claim 10, wherein said active layer is of an InGaAsP material.

12. A semiconductor laser device as claimed in claim 11, wherein said InGaAsP material is a bulk material.

13. A semiconductor laser device as claimed in claim 11, wherein said InGaAsP material is a material having a quantum well structure.

14. A semiconductor laser device as claimed in claim 11, wherein said pair of current confining regions further comprise:

a pair of recombination layers of an InGaAsP material, said pair of recombination layers being formed between said pair of second current blocking layers and said pair of second buried layers.

15. A semiconductor laser device as claimed in claim 14, wherein said pair of recombination layers are of the InGaAsP material having a band gap which is less than that of any one of the InP semiconductor material of said p-type and the InP semiconductor material of said n-type.

16. A semiconductor laser device as claimed in claim 11, wherein said pair of current confining regions further comprise:

a pair of recombination layers of an InGaAs material, said pair of recombination layers being formed between said pair of second current blocking layers and said pair of second buried layers.

17. A semiconductor laser device as claimed in claim 16, wherein said pair of recombination layers are of the InGaAs material having a band gap which is less than that of any one of the InP semiconductor material of said p-type and the InP semiconductor material of said n-type.

18. A semiconductor laser device comprising: a base layer of a semiconductor material of a first conductivity type, said base layer having a principal surface; a first cladding layer of a semiconductor material of said first conductivity type, said first cladding layer being formed on a predetermined area of said principal surface; an active layer of a stripe shape, said active layer being formed on said first cladding layer and having a pair of side surfaces opposed to each other; a second cladding layer of a semiconductor material of a second conductivity type, said second cladding layer being formed on said active layer; and a pair of current confining regions formed on a remaining area of said principal surface with said first cladding, said active, and said second cladding layers interposed between said pair of current confining regions, said pair of current confining regions being for confining a current in said active layer; said pair of current confining regions comprising:

a pair of first buried layers of a semiconductor material of said first conductivity type, said pair of first buried layers being formed on the remaining area of said principal surface;

a pair of first current blocking layers of a semiconductor material of said second conductivity type, said pair of first current blocking layers being formed on said pair of first buried layers;

a pair of low carrier concentration layers of a semiconductor material of said second conductivity type, said pair of low carrier concentration layers having a carrier concentration lower than that of each of said pair of first current blocking layers and formed on said pair of first current blocking layers;

a pair of second current blocking layers of a semiconductor material of said first conductivity type, said pair of second current blocking layers being formed on said pair of low carrier concentration layers; and a pair of second buried layers of a semiconductor material of said second conductivity type, said pair of second buried layers being formed on said pair of second current blocking layers;

said pair of first buried layers having a pair of projecting portions projecting over inner edge portions of said pair of first buried layers with said first cladding, said active, and said second cladding layers interposed between said pair of projecting portions and with said pair of projecting portions brought into contact with said side surfaces of said active layer and with inner edge portions of said pair of second current blocking layers so that said pair of first current blocking layers are electrically isolated from said active layer.

19. A semiconductor laser device as claimed in claim 18, each semiconductor material of said first conductivity type being an InP semiconductor material of a p-type, each semiconductor material of said second conductivity type being an InP semiconductor material of an n-type, said active layer being of an InGaAsP material, wherein said pair of low carrier concentration layers are of an InP semiconductor material of said n-type and have a carrier concentration less than $1 \times 10^{17} cm^{-3}$.

20. A semiconductor laser device as claimed in claim 19, wherein said InGaAsP material is a bulk material.

21. A semiconductor laser device as claimed in claim 19, wherein said InGaAsP material is a material having a quantum well structure.

22. A semiconductor laser device as claimed in claim 19, wherein said pair of current confining regions further comprise:

a pair of recombination layers of an InGaAsP material, said pair of recombination layers being formed between said pair of second current blocking layers and said pair of second buried layers.

23. A semiconductor laser device as claimed in claim 22, wherein said pair of recombination layers are of the InGaAsP material having a band gap which is less than that of any one of the InP semiconductor material of said p-type and the InP semiconductor material of said n-type.

24. A semiconductor laser device as claimed in claim 22, wherein said pair of current confining regions further comprise:

a pair of recombination layers of an InGaAs material, said pair of recombination layers being formed between said pair of second current blocking layers and said pair of second buried layers.

25. A semiconductor laser device as claimed in claim 24, wherein said pair of recombination layers are of the InGaAs material having a band gap which is less than that of any one of the InP semiconductor material of said p-type and the InP semiconductor material of said n-type.

26. A semiconductor laser device comprising: a base layer of a semiconductor material of a first conductivity type, said base layer having a principal surface; a first cladding layer of a semiconductor material of said first conductivity type, said first cladding layer being formed on a predetermined area of said principal surface; an active layer of a stripe shape, said active layer being formed on said first cladding layer and having a pair of side surfaces opposed to each other; a second cladding layer of a semiconductor material of a second conductivity type, said second cladding layer being formed on said active layer; and a pair of current confining regions formed on a remaining area of said principal surface with said first cladding, said active, and said second cladding layers interposed between said pair of current confining regions, said pair of current confining regions being for confining a current in said active layer; said pair of current confining regions comprising:

a pair of first buried layers of a semiconductor material of said first conductivity type, said pair of first buried layers being formed on the remaining area of said principal surface;

a pair of first current blocking layers of a semiconductor material of said second conductivity type, said pair of first current blocking layers being formed on said pair of first buried layers;

a pair of low carrier concentration layers formed on said pair of first current blocking layers;

a pair of second current blocking layers of a semiconductor material of said first conductivity type, said pair of second current blocking layers being formed on said pair of low carrier concentration layers; and a pair of second buried layers of a semiconductor material of said second conductivity type, said pair of second buried layers being formed on said pair of second current blocking layers;

said pair of low carrier concentration layers being of a semiconductor material of said first conductivity type and having a carrier concentration lower than that of each of said pair of second current blocking layers;

said pair of first buried layers having a pair of projecting portions projecting over inner edge portions of said pair of first buried layers with said first cladding, said active, and said second cladding layers interposed between said pair of projecting portions and with said pair of projecting portions brought into contact with said side surfaces of said active layer and with inner edge portions of said pair of second current blocking layers so that said pair of first current blocking layers are electrically isolated from said active layer.

27. A semiconductor laser device as claimed in claim 26, each semiconductor material of said first conductivity type being an InP semiconductor material of a p-type, each semiconductor material of said second conductivity type being an InP semiconductor material of an n-type, said active layer being of an InGaAsP material, wherein said pair of low carrier concentration layers are of an InP semiconductor material of said n-type and have a carrier concentration less than $1\times10^{17} cm^{-3}$.

28. A semiconductor laser device as claimed in claim 27, wherein said InGaAsP material is a bulk material.

29. A semiconductor laser device as claimed in claim 27, wherein said InGaAsP material is a material having a quantum well structure.

30. A semiconductor laser device as claimed in claim 27, wherein said pair of current confining regions further comprise:

a pair of recombination layers of an InGaAsP material, said pair of recombination layers being formed between said pair of second current blocking layers and said pair of second buried layers.

31. A semiconductor laser device as claimed in claim 30, wherein said pair of recombination layers are of the InGaAsP material having a band gap which is less than that of any one of the InP semiconductor material of said p-type and the InP semiconductor material of said n-type.

32. A semiconductor laser device as claimed in claim 27, wherein said pair of current confining regions further comprise:

a pair of recombination layers of an InGaAs material, said pair of recombination layers being formed between said pair of second current blocking layers and said pair of second buried layers.

33. A semiconductor laser device as claimed in claim 32, wherein said pair of recombination layers are of the InGaAs material having a band gap which is less than that of any one of the InP semiconductor material of said p-type and the InP semiconductor material of said n-type.

* * * * *